United States Patent
Ogata et al.

(10) Patent No.: US 9,721,813 B2
(45) Date of Patent: Aug. 1, 2017

(54) LIQUID PROCESSING APPARATUS WITH CLEANING JIG

(71) Applicant: Tokyo Electron Limited, Tokyo (JP)

(72) Inventors: Nobuhiro Ogata, Kumamoto (JP);
Hiromi Kiyose, Kumamoto (JP);
Hidetsugu Yano, Kumamoto (JP);
Tsukasa Hirayama, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 1058 days.

(21) Appl. No.: 13/937,306

(22) Filed: Jul. 9, 2013

(65) Prior Publication Data
US 2014/0014134 A1 Jan. 16, 2014

(30) Foreign Application Priority Data

Jul. 11, 2012 (JP) .................................. 2012-155635
Feb. 13, 2013 (JP) .................................. 2013-025841

(51) Int. Cl.
| H01L 21/00 | (2006.01) |
| B08B 13/00 | (2006.01) |
| B08B 3/04 | (2006.01) |
| H01L 21/67 | (2006.01) |
| H01L 21/687 | (2006.01) |

(52) U.S. Cl.
CPC .......... *H01L 21/67051* (2013.01); *B08B 3/04* (2013.01); *B08B 13/00* (2013.01); *H01L 21/68735* (2013.01)

(58) Field of Classification Search
CPC ...... B08B 13/00; B08B 3/04; H01L 21/67051
USPC ...................................... 134/104.1
See application file for complete search history.

(56) References Cited

U.S. PATENT DOCUMENTS 6,432,199 B1 * 8/2002 Takekuma .............. B05C 11/08
118/319
2011/0297192 A1 * 12/2011 Ogata ............... H01L 21/67051
134/94.1

FOREIGN PATENT DOCUMENTS

| JP | 04-322420 A | | 11/1992 |
| JP | 09232276 A | * | 9/1997 |
| JP | 10-323633 A | | 12/1998 |
| JP | 2000-315671 A | | 11/2000 |
| JP | 2010-016315 A | | 1/2010 |

* cited by examiner

*Primary Examiner* — Katelyn Whatley
(74) *Attorney, Agent, or Firm* — Abelman, Frayne & Schwab (57) ABSTRACT

The present disclosure provides a cleaning method which enables a cup and a member around the cup to be cleaned thoroughly. In this cleaning method, a cleaning liquid is supplied to a cleaning jig from the upper side of the cleaning jig while rotating the cleaning jig held by a substrate holding unit. The cleaning liquid supplied to the cleaning jig is scattered obliquely upward along an inclined surface of an inclined portion which is provided around the entire circumference of the cleaning jig in the vicinity of the outer circumferential edge of the cleaning jig, thereby cleaning cups.

8 Claims, 7 Drawing Sheets

LIQUID PROCESSING APPARATUS WITH CLEANING JIG

CROSS-REFERENCE TO RELATED APPLICATIONS

This application is based on and claims priority from Japanese Patent Application Nos. 2012-155635 and 2013-025841 filed on Jul. 11, 2012 and Feb. 13, 2013, respectively, with the Japan Patent Office and the disclosures of which are incorporated herein in their entireties by reference.

TECHNICAL FIELD

The present disclosure relates to a liquid processing apparatus for processing a substrate with processing liquid, a cleaning jig for cleaning an outer periphery of a rotation cup configured to surround the outer periphery of the substrate after supplying a cleaning liquid to the substrate that rotates within the rotation cup, and a cleaning method for cleaning at least the outer periphery of the rotation cup in the liquid processing apparatus.

BACKGROUND

In a semiconductor product manufacturing process or a flat panel display (FPD) manufacturing process, a process in which a processing liquid is supplied to a semiconductor wafer or a glass substrate that is a substrate to be processed to perform a liquid processing is frequently used. For example, such a process involves a cleaning processing that removes, for example, particles and pollutants attached to the substrate.

As for a liquid processing apparatus that performs such a processing, a single wafer processing unit is known in which a substrate such as, for example, a semiconductor wafer is held on a spin chuck and a processing is performed by supplying a processing liquid (for example, a chemical liquid and a rinse liquid) to a front surface or front and back surfaces of the substrate in a state where the substrate is rotated.

The processing liquid supplied to the substrate is shaken off from the rotating substrate and scattered in the form of mist at a peripheral region of a substrate holding unit. Japanese Patent Laid-Open Publication No. H10-323633 discloses a substrate processing apparatus including a scattering prevention cup configured to guide the processing liquid shaken off from the substrate to a cleaning liquid collecting path to collect the scattered mist.

In such a substrate processing apparatus, it is necessary to perform a cleaning of the scattering prevention cup itself which collects the processing liquid shaken off from the substrate. As for a method for cleaning the cup, a method of using a disc-shaped cleaning substrate is known as disclosed in Japanese Patent Laid-Open Publication No. 2000-315671. In an apparatus disclosed in Japanese Patent Laid-Open Publication No. 2000-315671, the cleaning substrate is adsorbed and held on a spin chuck like the substrate and the cleaning substrate is driven to rotate. A cleaning liquid supplied to the central location of the top surface of the cleaning substrate from the upper side of the cleaning substrate is guided to the outside in a diameter direction along the top surface of the cleaning substrate by centrifugal force. Also, the cleaning substrate is provided with "set-up fins" at predetermined intervals along the peripheral direction in the vicinity of the outer peripheral edge of the cleaning substrate. The cleaning liquid is guided obliquely upward along the fins and scattered obliquely upward from the edge portions of the fins. Meanwhile, the cleaning liquid guided to a portion where the fins are not provided is scattered substantially in a horizontal direction from the edge portion of the top surface of the cleaning substrate.

Also, a cleaning jig disclosed in Japanese Patent Laid-Open Publication No. 2010-16315 may also be used as for a method of cleaning a cup configured to collect the processing liquid shaken off from the substrate. In the cleaning method of using a cleaning jig disclosed in Japanese Patent Laid-Open Publication No. 2010-16315, as illustrated in FIG. 8 of the publication, the cleaning liquid supplied to the central location of the bottom surface of the cleaning jig which is held by the spin chuck is guided to the outside in a diameter direction along the bottom surface of the cleaning jig by centrifugal force. The cleaning liquid turns around and enters along the outer peripheral surface of the cleaning jig and is scattered obliquely upward, thereby cleaning the cup.

However, the cleaning method of the cup using the cleaning substrate disclosed in Japanese Patent Laid-Open Publication No. 2000-315671 has a problem that since the cleaning liquid scattered obliquely upward from the edge portions of the fins and the cleaning liquid guided to a portion where the fins are not provided and scattered substantially in a horizontal direction from the edge portion of the top surface of the cleaning substrate interfere with each other, the cleaning liquid may not be supplied accurately to a required location and thus the cup may not be thoroughly cleaned. Also, the cup cleaning method using a cleaning jig as disclosed in Japanese Patent Laid-Open Publication No. 2010-16315 has a problem in that the cleaning liquid may not be supplied simultaneously to the several locations such as, for example, to both of inner and outer surfaces of the cup since there is only one path via which the cleaning liquid is supplied to the cup from the cleaning jig as illustrated in FIG. 8 of Japanese Patent Laid-Open Publication No. 2010-16315.

SUMMARY

The present disclosure provides a liquid processing apparatus including: a substrate holding unit configured to hold a substrate to be processed horizontally so that the substrate is processed with a processing liquid; a substrate rotating mechanism configured to rotate the substrate holding unit; a cup configured to surround the substrate held by the substrate holding unit and receive the processing liquid after the processing liquid is supplied to the substrate; a cleaning jig configured to clean the cup and disposed on the substrate holding unit, the cleaning jig being formed in a disc shape and provided with an inclined portion on the top surface thereof around the entire circumference in the vicinity of the outer circumferential edge of the cleaning jig, and the inclined portion of the cleaning jig being inclined upward toward the outside in a diameter direction of the cleaning jig; a cleaning jig accommodating unit configured to accommodate the cleaning jig; and, a cleaning liquid supplying unit disposed at an upper side of the substrate holding unit and configured to supply a cleaning liquid. The cleaning liquid supplying unit supplies the cleaning liquid to the top surface of the cleaning jig when the cleaning jig is held by the substrate holding unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An aspect of the present disclosure is to provide a technique that enables a cup to be thoroughly cleaned and members in the vicinity of the cup to be also cleaned at the same time.

According to the present disclosure, the cleaning liquid may be accurately supplied to the required locations of the cup and the cup may be thoroughly cleaned since the inclined portion which is inclined upward toward the outer side of the diameter direction of the cleaning jig around the entire circumference in the vicinity of the outer circumferential edge of the cleaning jig.

The present disclosure provides a liquid processing apparatus including: a substrate holding unit configured to hold a substrate to be processed horizontally so that the substrate is processed with a processing liquid; a substrate rotating mechanism configured to rotate the substrate holding unit; a cup configured to surround the substrate held by the substrate holding unit and receive the processing liquid after the processing liquid is supplied to the substrate; a cleaning jig configured to clean the cup and disposed on the substrate holding unit, the cleaning jig being formed in a disc shape and provided with an inclined portion on the top surface thereof around the entire circumference in the vicinity of the outer circumferential edge of the cleaning jig, and the inclined portion of the cleaning jig being inclined upward toward the outside in a diameter direction of the cleaning jig; a cleaning jig accommodating unit configured to accommodate the cleaning jig; and, a cleaning liquid supplying unit disposed at an upper side of the substrate holding unit and configured to supply a cleaning liquid. The cleaning liquid supplying unit supplies the cleaning liquid to the top surface of the cleaning jig when the cleaning jig is held by the substrate holding unit.

In the liquid processing apparatus, the cleaning jig is formed with a through hole at the central part of the top surface, the through hole being configured to guide the cleaning liquid supplied to the top surface to the lower side of the cleaning jig through the cleaning jig.

Also, in the liquid processing apparatus, the cup includes a rotation cup attached to the substrate holding unit and a liquid collecting cup provided to surround the rotation cup, and the inclined portion is formed in an inclined shape such that the cleaning liquid is scattered toward a gap between the rotation cup and the liquid collecting cup.

Further, in the liquid processing apparatus, the cleaning jig includes a horizontal portion and the inclined portion, and a through hole is formed at a location where the horizontal portion and the inclined portion adjoin each other.

Furthermore, in the liquid processing apparatus, the through hole is provided a plurality of times in the circumferential direction of the cleaning jig.

In addition, the liquid processing apparatus further includes a guide part provided in the vicinity of the outer circumferential edge of the cleaning jig and the guide part is configured to guide the cleaning liquid discharged from the through hole of the inclined portion in the horizontal direction toward the outside in the diameter direction of the cleaning jig.

Also, in the liquid processing apparatus, the inclined portion is provided with inclined sections of at least two steps.

Also, the present disclosure provides a cleaning jig including: an inclined portion provided on the top surface of the cleaning jig around the entire circumference of the cleaning jig in the vicinity of the outer circumferential edge of the cleaning jig. The cleaning jig is formed in a disc shape and configured to clean a cup after a processing liquid is supplied to a substrate rotated within the cup, and the inclined portion is inclined upwardly toward the outside in a diametric direction of the cleaning jig.

Also, the cleaning jig is formed with a through hole at the central part of the top surface thereof and the through hole is configured to guide the cleaning liquid supplied to the top surface to the lower side of the cleaning jig through the cleaning jig.

In addition, the inclined portion of the cleaning jig is formed with a through hole.

Further, in the cleaning jig, the through hole is provided a plurality of times in the circumferential direction of the cleaning jig.

Furthermore, the cleaning jig further includes a guide part provided in the vicinity of the inclined portion and configured to guide the cleaning liquid discharged from the through hole of the inclined portion in the horizontal direction toward the outside in the diameter direction of the cleaning jig.

Also, in the cleaning jig, the inclined portion is provided with inclined sections of at least two steps.

Further, as for the cleaning method to clean at least the cup of the liquid processing apparatus, the present disclosure provides a cleaning method including: holding a disc-shaped cleaning jig by a substrate holding unit; rotating the cleaning jig by rotating the substrate holding unit; supplying a cleaning liquid from the upper side to the rotating cleaning jig; and allowing the cleaning liquid supplied to the cleaning jig to be scattered obliquely upward along an inclined surface of an inclined portion which is provided around the entire circumference of the cleaning jig in the vicinity of the outer circumferential edge of the cleaning jig, thereby cleaning at least a cup of a liquid processing apparatus.

The cleaning method further includes a process of cleaning a member located at the lower side of the cleaning jig while cleaning the cup simultaneously by guiding a part of the cleaning liquid supplied from the upper side of the rotating cleaning jig via through a hole formed on the cleaning jig.

Also, in the cleaning method, the cleaning liquid supplied to the cleaning jig is also guided horizontally toward the outside in the diameter direction of the cleaning jig.

Further, in the cleaning method, in the process of supplying the cleaning liquid from the upper side to the rotating cleaning jig, the rotation speed of the cleaning jig by the rotation of the substrate holding unit is changed during the process.

Furthermore, the cleaning method further includes a process of supplying the cleaning liquid from the lower side of the cleaning jig which is being rotated.

In addition, in the cleaning method, the rotation speed of the cleaning jig when the cleaning liquid is supplied from the upper side of the cleaning jig which is being rotated is higher than the rotation speed when the cleaning liquid is supplied from the lower side of the cleaning jig which is being rotated.

Figure 1:
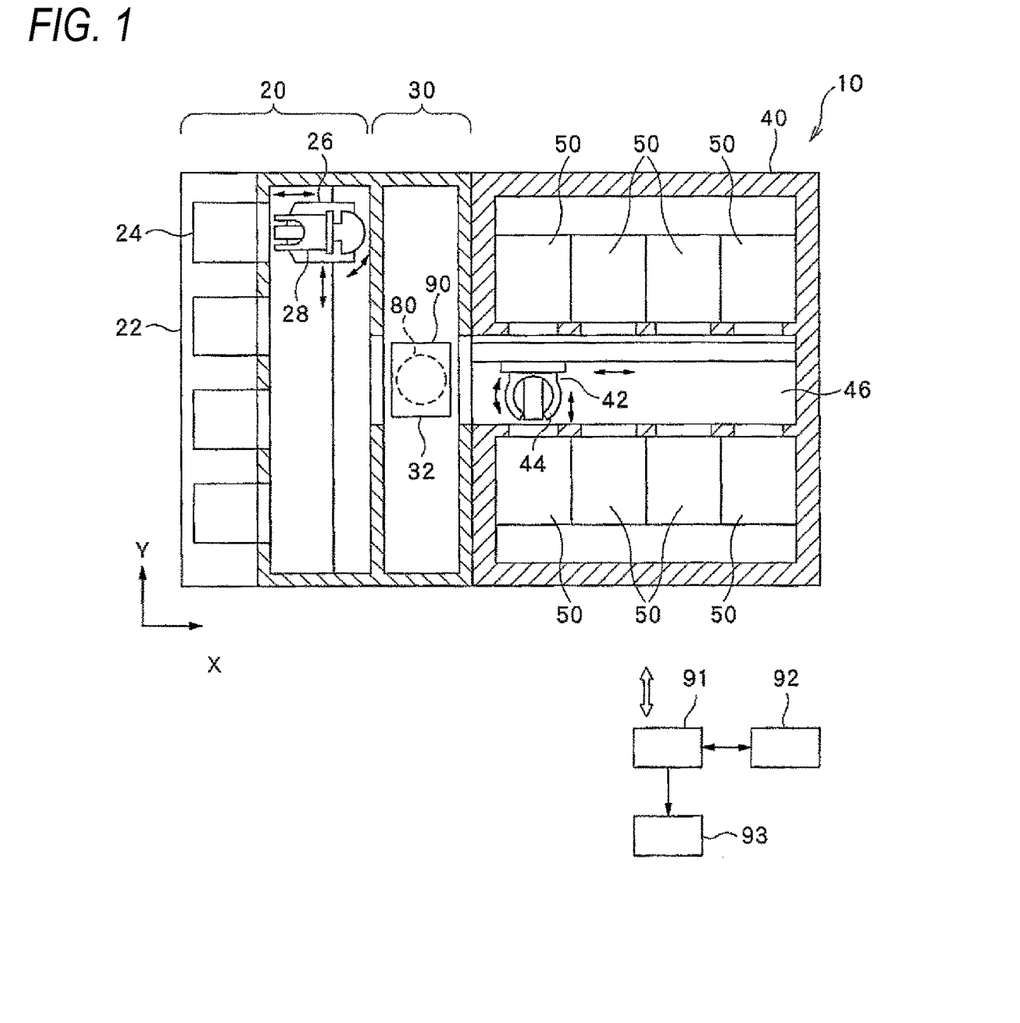
FIG. 1 is a cross-sectional plan view illustrating an entire configuration of a liquid processing apparatus of an exemplary embodiment the disclosure.
Figure 2:
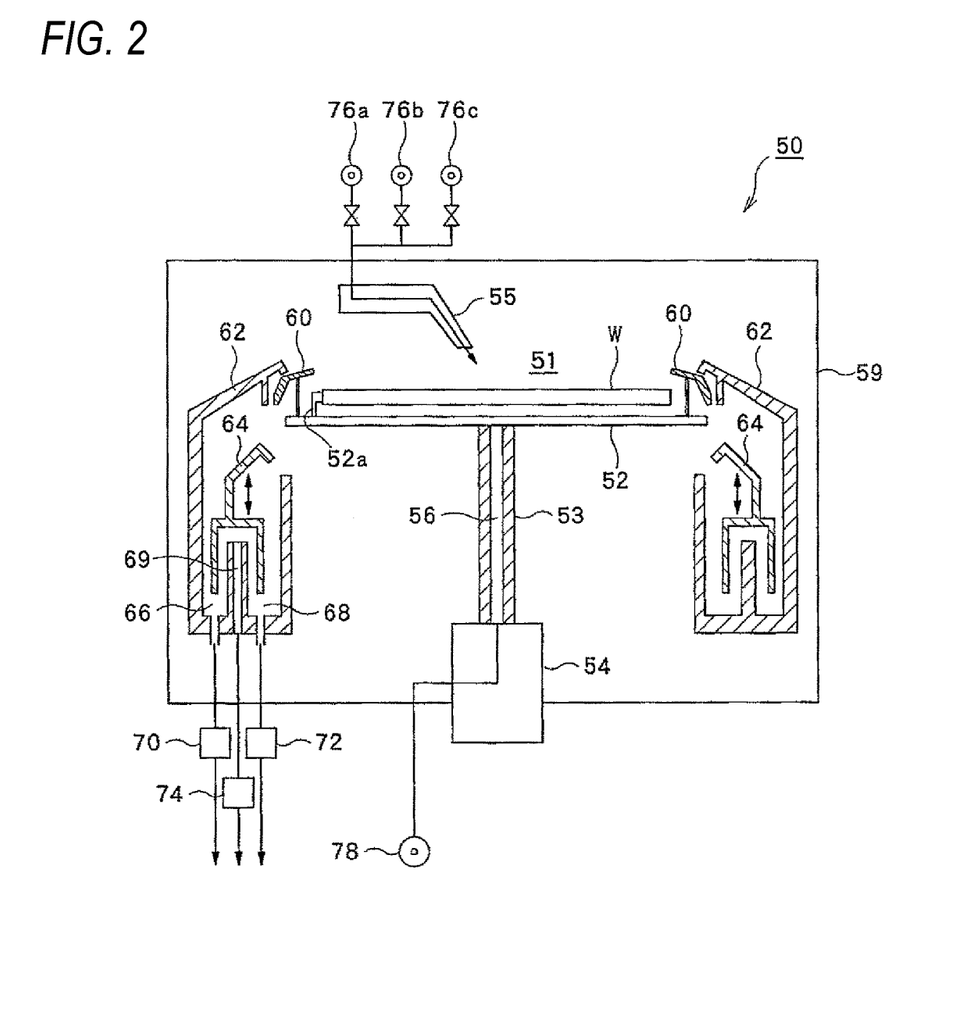
FIG. 2 is a view illustrating a configuration of a liquid processing unit provided in the liquid processing apparatus illustrated in FIG. 1.
Figure 3:
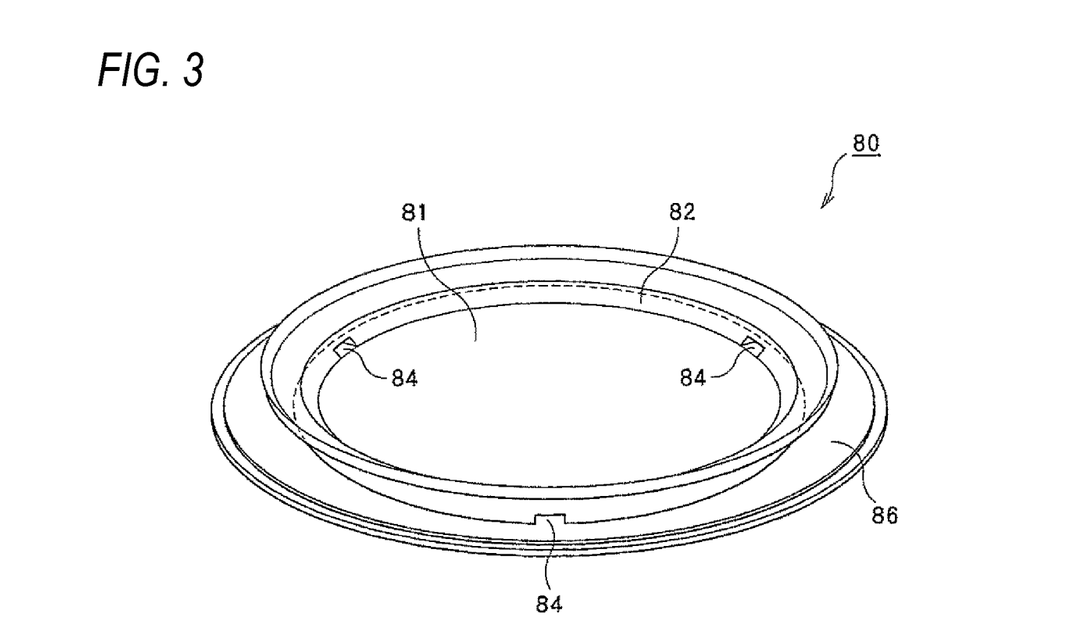
FIG. 3 is a perspective view illustrating a configuration of a cleaning jig used in the liquid processing unit illustrated in FIG. 2.
Figure 4:
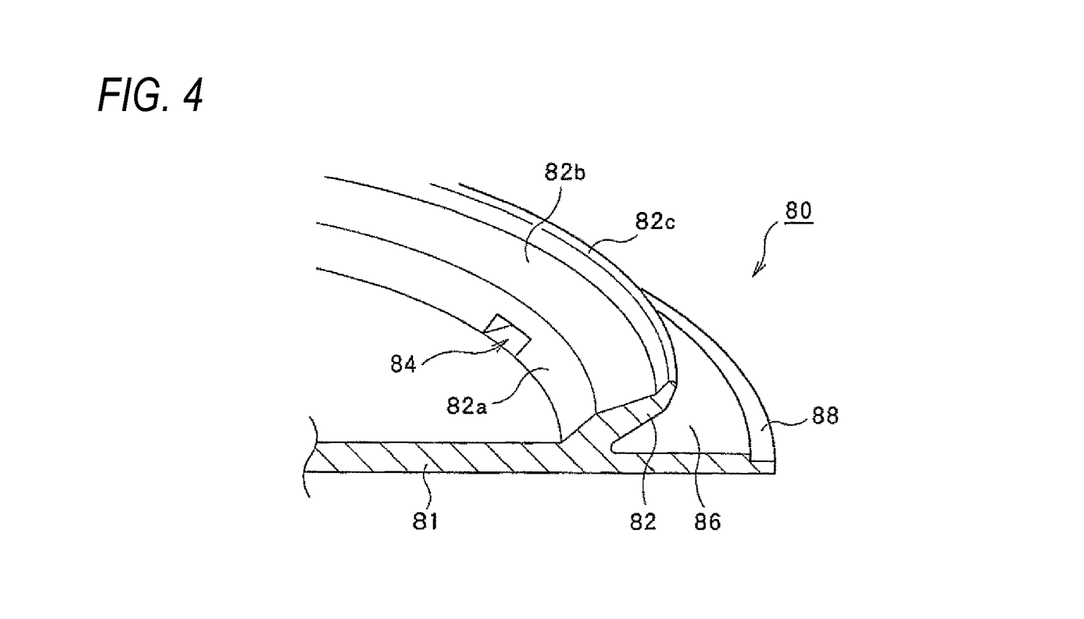
FIG. 4 is an enlarged perspective view illustrating a portion of the cleaning jig illustrated in FIG. 3.
Figure 5:
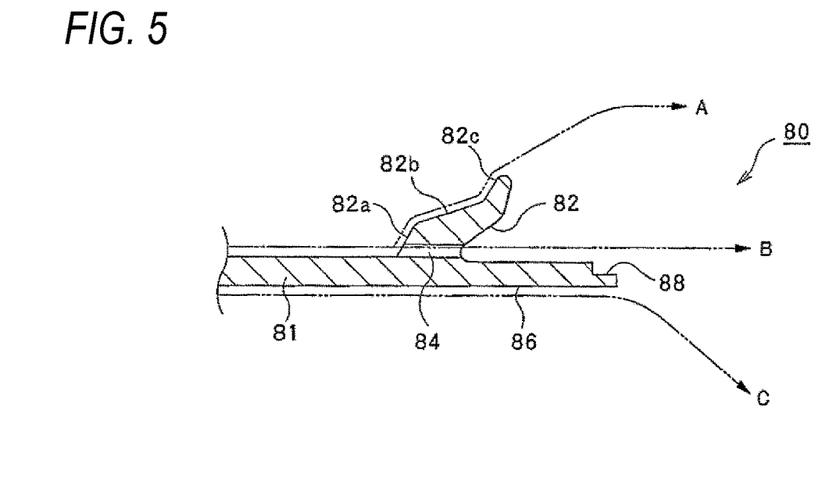
FIG. 5 is a cross-sectional view illustrating a portion of the cleaning jig illustrated in FIG. 4.

Hereinafter, exemplary embodiments of the present disclosure will be described with reference to the drawings. FIGS. 1 to 9 are views illustrating a configuration of a liquid processing apparatus according to an exemplary embodiment of the present disclosure. Among views, FIG. 1 is a cross-sectional plan view illustrating an entire configuration of the liquid processing apparatus of an exemplary embodiment of the present disclosure and FIG. 2 is a view illustrating a configuration of a liquid processing unit provided in the liquid processing apparatus illustrated in FIG. 1. Also, FIG. 3 is a perspective view illustrating a configuration of a cleaning jig used in the liquid processing unit illustrated in FIGS. 2 4 is an enlarged perspective view illustrating a portion of the cleaning jig illustrated in FIG. 3. FIG. 5 is a cross-sectional view of a portion of the cleaning jig illustrated in FIG. 4. Further, FIGS. 6 to 9 are views illustrating a path of a cleaning liquid when a cleaning, for example, a rotation cup is performed using the cleaning jig illustrated in FIGS. 3 to 5.

Firstly, descriptions will be made on the entire configuration of the liquid processing apparatus of the exemplary embodiment of the present disclosure with reference to FIG. 1. A liquid processing apparatus 10 illustrated in FIG. 1 performs a liquid processing in which a chemical liquid which is a processing fluid is supplied to a substrate to be processed W ("wafer W") to remove particles or pollutants attached to the wafer W. As illustrated in FIG. 1, the liquid processing apparatus 10 of the present exemplary embodiment is provided with a carrier placing block 20 where carry-in/carry-out of a carrier 24 in which a plurality of wafers Ware received from the outside is performed, a delivery block 30 provided with a wafer W delivery unit, and a processing block 40 configured to perform a predetermined liquid processing on the wafer W. The carrier placing block 20 is set as the front side and the carrier placing block 20, the delivery block 30, and the processing block 40 are arranged in a line in the longitudinal direction (X direction of FIG. 1) and connected with one another.

The carrier placing block 20 is provided with, for example, a carrier placing unit 22 on which four carriers 24 are disposed and a first transfer unit 26 which performs a delivery of the wafer W between the carriers 24 disposed on the carrier placing unit 22 and the delivery block 30. In the first transfer unit 26, a holding arm 28 that holds the wafer W is configured to be, for example, reciprocable in the longitudinal direction, movable in the left-and-right direction (Y direction of FIG. 1), rotatable, and elevatable.

The delivery block 30 is provided with a delivery stage 32 configured in a multi-stage construction which is configured such that the first transfer unit 26 and a second transfer unit 42 (described below) provided in the processing block 40 may access to the delivery stage 32, respectively. Also, a cleaning jig accommodating unit 90 configured to accommodate a disc-shaped cleaning jig 80 is provided at the upper side of the delivery stage 32. The cleaning jig 30 accommodated in the cleaning jig accommodating unit 90 is used when cleaning, for example, an outer circumference of a rotation cup 60 (described below) in a liquid processing unit 50. A configuration of such cleaning jig 80 will be described in detail below.

The processing block 40 is provided with a transfer path 46 of a wafer W extending in the longitudinal direction (X direction of FIG. 1) and the transfer path 46 is provided with the second transfer unit 42. Also, for example, two liquid processing units 50 are provided at left and right of the transfer path 46 to be opposite to each other when viewed from the carrier placing block 20 side. The second transfer unit 42 performs the delivery of wafers W in relation to the total four liquid processing units 50 and the delivery stage 32. The second transfer unit 42 is provided with a holding arm 44 configured to hold the circumferential edge of the rear surface side of a wafer W. The holding arm 44 is installed to be reciprocable, rotatable, elevatable, and movable long the transfer path 46.

Next, the configuration of the liquid processing unit 50 will be described in detail with reference to FIG. 2. As illustrated in FIG. 2, the liquid processing unit 50 includes: a liquid processing chamber 51 in which a wafer W is carried-in/carried-out by the second transfer unit 42 and processed; a chamber 59 which is formed with the liquid processing chamber 51 in the inside thereof; and a substrate holding table (a substrate holding unit) 52 configured to hold a wafer W horizontally. The substrate holding table 52 is connected with a rotation motor (a substrate rotating mechanism) 54 configured to rotate the substrate holding table 52 via a rotation driving shaft 53. Also, the substrate holding table 52 is provided with a substrate holding body 52a and the wafer W is held by the substrate holding body 52a of at the circumferential edge of the substrate holding table 52 and rotated within a horizontal plane by driving the rotation motor 54.

As illustrated in FIG. 2, the liquid processing chamber 51 is provided with a nozzle (processing liquid supply unit) 55 which selectively discharges (supplies) plural kinds of processing liquids to the wafer W held on the substrate holding mount. That is, the nozzle 55 is connected with each of an acid processing liquid supply source 76a, an alkali processing liquid supply source 76b, and a cleaning liquid supply source 76c. The acid processing liquid, the alkali processing liquid, and the cleaning liquid are selectively sent from the supply sources 76a to 76c to the nozzle 55 and are discharged to the surface of the wafer W. Also, as for the acid processing liquid, for example, SPM liquid (mixed solution of sulfuric acid and hydrogen peroxide), HF liquid (hydrogen fluoride liquid), or SC2 liquid (a mixed solution of hydrochloric acid and hydrogen peroxide) may be used. As for the alkali processing liquid, for example, SC1 liquid (ammonia hydrogen peroxide) or ammonia liquid may be used. In addition, as for the cleaning liquid, for example, pure water may be used.

Also, as illustrated in FIG. 2, a cleaning liquid supply tube 56 is provided inside of the rotation driving shaft 53 and the cleaning liquid is discharged (supplied) to the rear surface (bottom surface) of the wafer W held on the substrate holding table 52 by the cleaning liquid supply tube 56. The cleaning liquid supply tube 56 is connected with a cleaning liquid supply source 78 and the cleaning liquid is sent to the cleaning liquid supply tube 56 by the cleaning liquid supply source 78.

As illustrated in FIG. 2, the substrate holding table 52 is provided with a rotation cup 60 configured to receive the processing liquid scattered from the rotating wafer W or the mist thereof. The rotation cup 60 has an upper opening and is formed generally in a ring shape in which an opening of lower end portion is formed in a diameter larger than that of the upper opening. The cross-section of the rotation cup 60 has a curved shape which seems to protrude to the upper side. That is, as illustrated in FIG. 2, the rotation cup 60 is formed to extend to the outside in the radial direction of the wafer W from the upper side of circumferential edge of the wafer W.

Also, as illustrated in FIG. 2, a liquid collecting cup 62 is provided to surround the rotation cup 60. A gap is formed between the liquid collecting cup 62 and the rotation cup 60. The liquid collecting cup 62 of which the position is fixed is provided inside of the liquid processing chamber 51 and collects the processing liquid scattered from the rotating wafer W or the mist thereof. Also, an elevating cup 64 configured to be elevatable is provided in the vicinity of the liquid collecting cup 62. The elevating cup 64 is connected with an elevating cylinder (not illustrated) and elevated between a lower side position as illustrated in FIG. 2 and an upper side position which is higher than the position illustrated in FIG. 2.

Also, a first processing liquid collecting tank 66 and a second processing liquid collecting tank 68 are provided respectively at the lower part of the liquid collecting cup 62. When an acid processing is performed on the wafer W held on the substrate holding table 52, the elevating cup 64 is positioned at the lower side position illustrated in FIG. 2 and the acid processing liquid supplied from the nozzle 55 to the wafer W and scattered from the wafer W is sent to the first processing liquid collecting tank 66. Meanwhile, when an alkali processing is performed on the wafer W held on the substrate holding table 52, the elevating cup 64 is positioned at the upper side position and the alkali processing liquid supplied from the nozzle 55 to the wafer W and scattered from the substrate is sent to the second processing liquid collecting tank 68. Also, the first processing liquid collecting tank 66 and the second processing liquid collecting tank 68 are connected with drain units 70, 72, respectively and the acid processing liquid or the alkali processing liquid sent to the first processing liquid collecting tank 66 or the second processing liquid collecting tank 68 are drained by these drain units 70, 72. Further, the cleaning liquid may be sent to any of the first processing liquid collecting tank 66 and the second processing liquid collecting tank 68.

As illustrated in FIG. 2, an exhaust path 69 configured to discharge the atmosphere around the wafer W held by the substrate holding table 52 via the liquid collecting cup 62 or the elevating cup 65 is provided between the first processing liquid collecting tank 66 and the second processing liquid collecting tank 68. The exhaust path 69 is connected with a suction unit 74 and the atmosphere sent to the exhaust path 69 is adapted to be sucked by the suction unit 74.

Also, as illustrated in FIG. 1, the liquid processing apparatus 10 is provided with a control unit 91 and the first transfer unit 26, the second transfer unit 42, the rotation motor 54, and the elevating cylinder (not illustrated) are controlled by the control unit 92. Further, the control unit 91 selects a processing liquid discharged to the wafer W via the nozzle 55. That is, the acid processing liquid is discharged from the nozzle 55 by the control unit 92 when the acid processing of the wafer W is performed, the alkali processing liquid is discharged from the nozzle 55 when the alkali processing of the wafer W is performed, and a cleaning liquid is discharged from the nozzle 55 when the cleaning processing of the wafer W is performed.

As illustrated in FIG. 1, the control unit 91 is connected with an input/output device 92. The input/output device 92 is configured, for example, by a keyboard performing, for example, an input operation of a command or by a display configured to visualize and display, for example, an operation situation of the liquid processing unit 50. Also, the control unit 91 may access to a storage medium 93 in which, for example, a program to implement a processing performed in the liquid processing unit 50 is stored. The storage medium 93 may be configured by a known storage medium such as, for example, a memory such as a ROM and a RAM and a disk type storage medium such as a hard disk, a CD-ROM, a DVD-ROM, and a flexible disk. In this way, the control unit 91 executes, for example, a program stored in the storage medium 93 in advance; therefore, the processing of a wafer W of the liquid processing unit 50 is performed.

When performing the cleaning of the rotation cup 60 or the liquid collecting cup 62 of such a liquid processing unit 50, the disc-shaped cleaning jig 80 accommodated in a cleaning jig accommodating unit 90 is disposed on the substrate holding table 52. At this time, the cleaning jig 80 is held by the substrate hold body 52a of the substrate holding table 52. The cleaning jig 80 held on the substrate holding table 52 is rotated when the substrate holding table 52 is rotated by the rotation motor 54. The cleaning liquid is discharged on the top surface of the cleaning jig 80 from the nozzle 55 in a state in which the cleaning jig 80 rotates. The discharged cleaning liquid is guided to the outside in the diameter direction along the top surface of the cleaning jig 80 by centrifugal force and the cleaning liquid is scattered from the outer circumferential edge of the cleaning jig 80. Accordingly, the cleaning liquid is supplied to the rotation cup 60 and the liquid collecting cup 62.

A detailed configuration of the cleaning jig 80 used in the liquid processing apparatus 10 of the present exemplary embodiment will be described with reference to FIGS. 3 to 5. Here, FIG. 3 is a perspective view illustrating the configuration of cleaning jig 80 used in the liquid processing unit 50 illustrated in FIG. 2, FIG. 4 is an enlarged perspective view illustrating a portion of the cleaning jig 80 illustrated in FIG. 3, and FIG. 5 is a cross-sectional view of a portion of the cleaning jig 80 illustrated in FIG. 4.

As illustrated in FIG. 3, the cleaning jig 80 generally has a disc shape. As illustrate in FIGS. 3 to 5, the cleaning jig 80 is provided with a horizontal portion 31 and an inclined portion 82 which is provided around the entire circumference in the vicinity of the outer circumferential edge and inclined upward toward the outer side of the diameter direction (right side of FIGS. 4 and 5) of the cleaning jig 80. Such an inclined portion 82 is provided with at least two steps of inclined sections. The inclined portion 82 illustrated in FIGS. 4 and 5 is provided with an inclination portion of three steps that are a first inclined section 82a, a second inclined section 82b, and a third inclined section 82c.

The configuration of the inclined portion 82 will be described in more detail. The inclined portion 82 has a shape which causes the cleaning liquid to be scattered obliquely upward toward a gap between the rotation cup 60 and the liquid collecting cup62 when the cleaning liquid is supplied to the top surface of the cleaning jig 80 held on the substrate holding table 52 from the nozzle 55. Here, the inclination angle of the third inclined section 82c is caused to be larger than the inclination angle of the first inclined section 82a or the second inclined section 82b since the cleaning liquid is caused to be scattered obliquely upward as arrow A of FIG. 5 illustrates toward the gap between the rotation cup 60 and the liquid collecting cup 62. Also, since the inclined portion 82 is provided around the entire circumference of the cleaning jig 80, the cleaning liquid scattered from the inclined portion 82 and supplied to the gap between the rotation cup 60 and the liquid collecting cup 62 is brought into a form of water film. Accordingly, the cleaning liquid may be accurately supplied to the gap; therefore, the outer circumference of the rotation cup 60 and the inner circumference of upper part of the liquid collecting cup 62 may be thoroughly cleaned.

Also, as illustrated in FIGS. 3 to 5, through holes 84 are formed which extend horizontally at a location where the horizontal portion 81 and the inclined portion 82 are connected with each other and the cleaning liquid entering into the through holes 84 out of the cleaning liquid supplied to the cleaning jig 80 is scattered substantially in the horizontal direction toward the outside in the diameter direction of the cleaning jig 80 (see arrow B of FIG. 5). A plurality of such through holes 84 are formed at the same intervals along the circumferential direction of the cleaning jig 80. In the example illustrated in FIG. 3, three through holes 84 are formed and equally spaced along the circumferential direction of the cleaning jig 80. Also, as illustrated in FIGS. 4 and 5, a guide part 86 is provided in the vicinity of the outer circumferential edge of the cleaning jig 80 and the cleaning liquid come out from the through hole 84 is guided substantially in the horizontal direction toward the outside of the diameter direction of the cleaning jig by the guide part 86. Accordingly, since a plurality of paths may be formed for the processing liquid supplied to, for example, the rotation cup 60 from the cleaning jig 80, the cleaning liquid may be supplied to multiple locations of the rotation cup 60. For example, the cleaning liquid may be supplied to both of inner and outer surfaces of the rotation cup 60.

Also, as illustrated in FIGS. 4 and 5, of an end edge 88 of the cleaning jig 80 has a thickness which is the same as that of a circumferential edge of the wafer W and has a shape which may be held by the substrate holding body 52a of the substrate holding table 52.

Next, a cleaning method of, for example, the rotation cup 60 of the liquid processing unit 50 using the cleaning jig 80 which has such a configuration will be described below with reference to FIGS. 6 to 9.

In performing the cleaning of, for example, the rotation cup 60 of the liquid processing unit 50, the disc-shaped cleaning jig 80 accommodated in the cleaning jig accommodating unit 90 is carried into the liquid processing unit 50 by the second transfer unit 42 firstly and disposed on the substrate holding table 52, and the end portion edge 88 of the cleaning jig 80 is held by the substrate holding body 52a of the substrate holding table 52. At this time, the inclined portion 82 provided on the cleaning jig 80 is oriented toward the upper side, i.e., toward the nozzle 55 side. Also, the cleaning jig 80 held on the substrate holding table 52 is rotated at the first rotation speed by rotating the substrate holding table 52 by the rotation motor 54.

Figure 6:
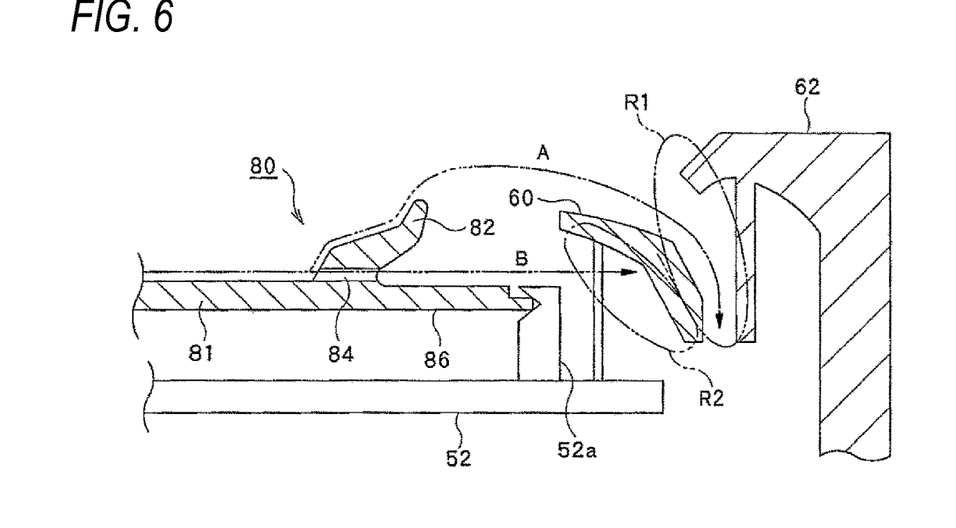
FIG. 6 is a view illustrating a path of a cleaning liquid when a cleaning jig is rotated at a first rotation speed and the cleaning liquid is supplied to the cleaning jig from the upper side.

Thereafter, in a state in which the cleaning jig 80 rotates, the cleaning liquid is supplied to the central location of the top surface of the cleaning jig 80 by the nozzle 50. FIG. 6 is a view illustrating a path of the cleaning liquid when a cleaning jig is rotated at the first rotation speed and the cleaning liquid is supplied to the cleaning jig from the upper side. As illustrated in FIG. 6, the cleaning liquid supplied to the central location of the top surface of the cleaning jig 80 is guided to the outside in the diameter direction along the top surface of the cleaning jig 80 by the centrifugal force. Most of the cleaning liquid is sent to the inclined surface of the inclined portion 82, guided further to the outside in the diameter direction along the inclined surface, and finally scattered from the third inclined section 82c to the outside in the diameter direction obliquely upward as indicated by arrow A of FIG. 6 illustrates. By this, the cleaning liquid is also sent to the gap between the rotation cup 60 and the liquid collecting cup 62; therefore, the outer circumference of the rotation cup 60 and the inner circumference of the upper part of the liquid collecting cup 62 (a region depicted by a two-dot chain line_R1 in FIG. 6) may be cleaned.

Also, some of the cleaning liquid entered into the through holes 84 of the inclined portion 82 and the cleaning liquid entered into the through holes 84 is scattered in the substantially horizontal direction toward the outer side of the diameter direction of the cleaning jig 80 as arrow B of FIG. 6 illustrates. By this, the cleaning liquid is also sent to the inner surface of the rotation cup 60; therefore, the inner surface of the rotation cup 60 (a region depicted with a two-dot chain line R2 in FIG. 6) may be cleaned.

Like this, since the cleaning jig 80 is provided with the inclined portion 82 around the entire circumference thereof and the inclined portion 82 is formed with through holes 84, the cleaning liquid may be accurately supplied to the inner surface and the outer surface of the rotation cup 60, respectively.

Also, in the liquid processing unit 50 of the present exemplary embodiment, the cleaning liquid is adapted to be supplied not only to the top surface of the cleaning jig 80 held by the substrate holding table 52 but also to the bottom surface. More particularly, the cleaning liquid is supplied to the central location of the cleaning jig 80 from the lower side by the cleaning liquid supplying tube 56 provided inside of the rotation driving shaft 53 in a state in which the cleaning jig 80 is held on the substrate holding table 52 and the cleaning jig 80 rotates. The cleaning liquid supplied to the central location of the bottom surface of the cleaning jig 80 is guided to the outside in the diameter direction along the bottom surface of the cleaning jig 80 by centrifugal force and finally scattered to the outside in the diameter direction from the end edge 88 of the cleaning jig 80 as indicated by arrow C of FIG. 5 illustrates. By this, in the rotation up 60, the cleaning liquid may be supplied more thoroughly to the inside of the rotation cup 60 since the cleaning liquid may be supplied to a location which is different from the location where the cleaning liquid scattered from the cleaning jig 80 via through holes 84 of the inclined portion 82 reaches (Refer to arrow B of FIG. 5.).

Figure 7:
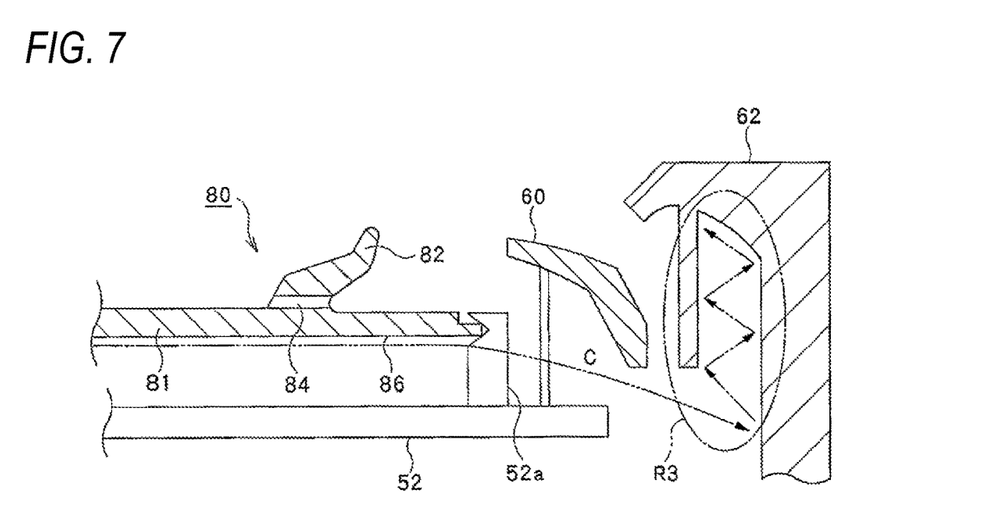
FIG. 7 is a view illustrating a path of a cleaning liquid when the cleaning jig is rotated at a second rotation speed which is larger than the first rotation speed and the cleaning liquid is supplied to the cleaning jig from the lower side.

More specifically, when the entire inner circumference of the liquid collecting cup 62 is cleaned, the cleaning liquid is supplied only to the bottom surface of the cleaning jig 80 in a state in which the cleaning jig 80 is rotated at the second rotation speed which is larger than the first rotation speed. FIG. 7 is a view illustrating a path of the cleaning liquid when the cleaning jig 80 is rotated at the second rotation speed which is larger than the first rotation speed and the cleaning liquid is supplied to the cleaning jig from the lower side. When the cleaning liquid is supplied only to the bottom surface of the cleaning jig 80 in a state in which the cleaning jig 80 is rotated at the second rotation speed, the cleaning liquid is scattered to the outside of the diameter direction from the end edge 88 of the cleaning jig 80 as indicated by arrow C of FIG. 7 and the processing liquid splashes by colliding the inner circumference of the liquid collecting cup 62. Therefore, the entire inner circumference of the liquid collecting cup 62 (a region depicted with a two-dot chain line R3 in FIG. 7) may be cleaned. Also, the elevating cup 64 is elevated while the cleaning liquid is being supplied to the top surface of the cleaning jig 80 in a state in which the cleaning jig 80 is rotated at the second rotation speed which is larger than the first rotation speed. By this, the outer circumference or inner circumference of the elevating cup 64 may be cleaned.

Figure 8:
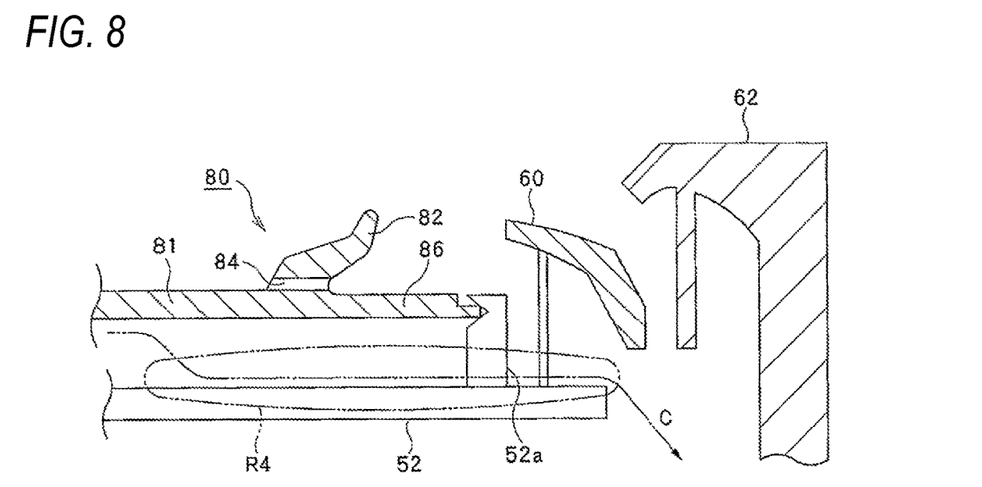
FIG. 8 is a view illustrating a path of a cleaning liquid when a cleaning jig is rotated at a low speed and the cleaning liquid is supplied to the cleaning jig from the lower side.

Meanwhile, when the top surface of the substrate holding table 52 is cleaned, the cleaning liquid is supplied to the bottom surface of the cleaning jig 80 in a state in which the rotation speed of the cleaning jig 80 is reduced. FIG. 8 is a view illustrating a path of the cleaning liquid when the cleaning jig 80 is rotated at a low speed and the cleaning liquid is supplied to the cleaning jig 80 from the lower side. In this case, since the centrifugal force exerted to the cleaning liquid is small, it is easy for the cleaning liquid to fall down onto the substrate holding table at the lower side when the cleaning liquid is guided along the bottom surface of the cleaning jig 80 (see arrow C of FIG. 8). Therefore, the cleaning liquid may be supplied to the top surface of the substrate holding table 52 and the top surface of the substrate holding table 52 (a region depicted with a two-dot chain line_R4) may be cleaned.

After the cleaning is ended, the supply of cleaning liquid is stopped and the cleaning jig 80 is dried by rotation. At this time, the cleaning liquid remaining on the top surface of the cleaning jig 80 is discharged via the through holes 84. The rotation cup 60 may also be dried since the rotation cup 60 rotates.

Figure 9:
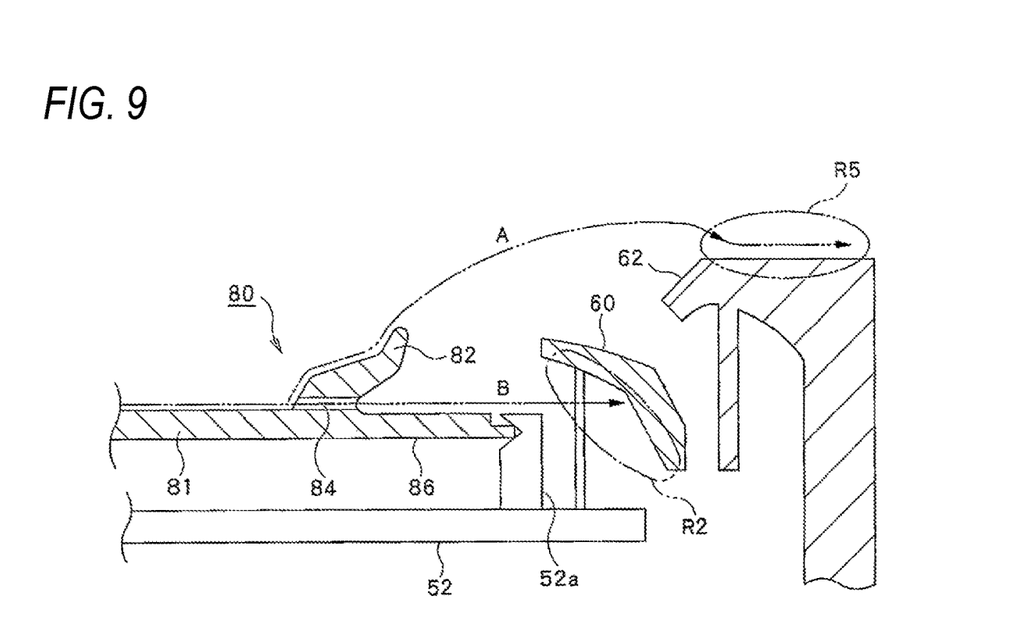
FIG. 9 a view illustrating a path of a cleaning liquid when the cleaning jig is rotated at the second rotation speed which is larger than the first rotation speed and the cleaning liquid is supplied to the cleaning jig from the upper side.

Also, the cleaning liquid may be supplied to the central location of the top surface of the cleaning jig 80 by the nozzle 55 in a state in which the cleaning jig 80 is rotated at the second rotation speed which is larger than the first rotation speed. FIG. 9 a view illustrating a path of the cleaning liquid when the cleaning jig 80 is rotated at the second rotation speed which is larger than the first rotation speed and the cleaning liquid is supplied to the cleaning jig 80 from the upper side. In this case, since the centrifugal force exerted to the cleaning liquid supplied to the top surface of the cleaning jig 80 is increased, the cleaning liquid scattered from the third inclined section 82c of the inclined portion 82 is caused to fly over the liquid collecting cup 62 as arrow A of FIG. 9 illustrates. In this way, the cleaning liquid is sent to the region depicted with a two-dot chain lineR5 in FIG. 9 and the cleaning liquid is also supplied to the outer circumference of the liquid collection cup 62 and the chamber 59 surrounding the liquid processing chamber 51 of the liquid processing unit 50. Therefore, the cleaning of the outer circumference of the liquid collection cup 62 and the chamber 59 may be performed.

According to the liquid processing apparatus 10, the cleaning jig 80, and the cleaning method of the present exemplary embodiment as described above, the cleaning jig 80 is provided with the inclined portion 82 inclined upward toward the outer side of the diameter direction of the cleaning jig 80 around the entire circumference in the vicinity of the outer circumferential edge of the cleaning jig 80 on the top surface where the cleaning liquid is supplied from the nozzle 55 when the cleaning jig 80 is held on the substrate holding table 52. Like this, since the inclined portion 82 is provided around the entire circumference of the cleaning jig 80, the cleaning liquid scattered from the inclined portion 82 and supplied to, for example, the rotation cup 60 becomes a form of water film; therefore, the cleaning liquid may be accurately supplied to the desired locations such as, for example, the rotation cup 60. Accordingly, the outer circumference of the rotation cup 60 or the inner circumference of the liquid collecting cup 62 may be thoroughly cleaned.

Also, the liquid processing apparatus, the cleaning jig, and the cleaning method of the present exemplary embodiment is not limited to the above-described exemplary embodiment and various changes may be added.

For example, in the cleaning jig 80, it is not necessarily needed to form the through holes 82 at the inclined portion 82. Even when the inclined portion 82 which is not formed with the through holes 84 is used, the cleaning liquid scattered from the inclined portion 82 and supplied to, for example, the rotation cup 60 is brought into a form of water film when the inclined portion 82 is provided around the entire circumference of the cleaning jig 80. Therefore, the cleaning liquid may be accurately supplied to a desired location such as, for example, the rotation cup 60. Also, the through holes 84 may not extend horizontally. As long as the cleaning liquid may be supplied to a desired location such as, for example, the rotation cup 60, the through holes 84 may be inclined to be oriented upward. In a case in which the through holes 84 are inclined to be oriented upward, the upper side of the inner circumference of the rotation up 60 may be surely cleaned.

Also, when the cleaning jig 80 rotates while the cleaning jig 80 is being held by the substrate holding table 52, the cleaning liquid may be supplied only to the top surface of the cleaning jig 80 without being supplied to the bottom surface of the cleaning jig 80.

Further, although an example in which the inclined portion 82 is provided with multi-stepped inclined sections is exemplified in FIGS. 4 and 5, it is not necessarily needed for the inclined portion 82 to be provided with multi-step inclination inclined sections. Even when the inclined portion 82 is not provided with the multi-step inclined sections, the cleaning liquid scattered from the inclined portion 82 of the cleaning jig 80 to the outer side may be supplied to a desired location such as, for example, the rotation cup 60 when the inclined portion 82 is inclined upward toward the outside in the diameter direction of the cleaning jig 80.

Figure 10:
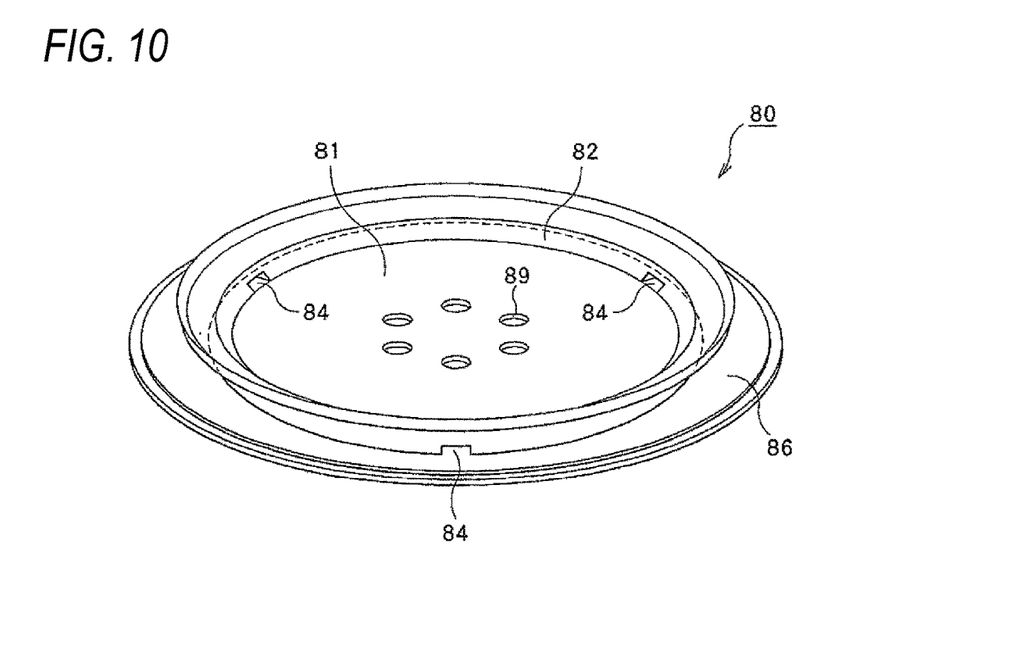
FIG. 10 is a perspective view illustrating a configuration of a cleaning jig of another exemplary embodiment.
Figure 11:
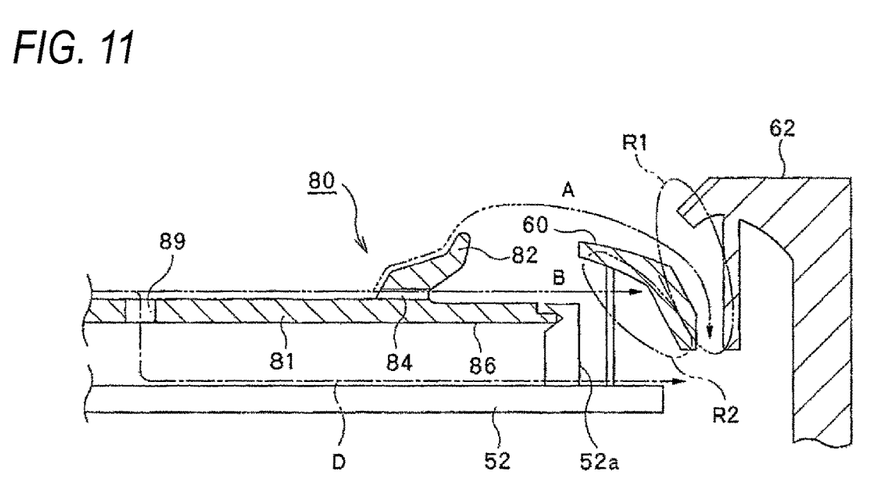
FIG. 11 is a view illustrating a path of a cleaning liquid when the cleaning jig illustrated in FIG. 10 is rotated at the first rotation speed and the cleaning liquid is supplied to the cleaning jig from the upper side.

Furthermore, as illustrated in FIG. 10, through holes 89 which penetrate the horizontal portion 81 vertically may be provided on the central section of the cleaning jig 80, i.e., on the central section of the horizontal portion 81. In the example illustrated in FIG. 9, a plurality of cylindrical through holes 89 (here, six through holes) are formed at locations where the circumference concentric to the cleaning jig 80 is equally divided. When the cleaning liquid is supplied to the central location of the top surface of the cleaning jig 80 by the nozzle 55 in a state in which the cleaning jig 80 illustrated in FIG. 10 is rotated, a part of the cleaning liquid falls off onto the top surface of the substrate holding table 52 and flows toward the outside in the diameter direction along the top surface of the substrate holding table 52 by the centrifugal force as illustrated in FIG. 11 (see chain-line arrow D). By the flow of the cleaning liquid, the top surface of the substrate holding table 52 may be cleaned. The residue of the cleaning liquid supplied to the top surface of the cleaning jig 80, by centrifugal force, passes by between the adjacent through holes 89 (or flies over the through holes 89) and flows toward the outside in the diameter direction along the top surface of the horizontal portion 81. Then, in the same aspect with the aspect described with reference to FIG. 6 earlier, the residue of the cleaning liquid is scattered to the outside in the diameter direction via the inclined portion 82 or a guide portion 86 (see chain-line arrows A and B in FIG. 11) and the rotation cup 60 and the liquid collecting cup 62 are cleaned accordingly. Not only the rotation cup 60 and the liquid collecting cup 62 but also the substrate holding table 52 which is in the vicinity of the rotation cup 62 and the substrate holding table 52 may be cleaned with a single cleaning processing by using the cleaning jig 80 illustrated in FIG. 10, thereby enhancing the cleaning efficiency. Also, even when the cleaning jig 80 illustrated in FIG. 10 is used, the centrifugal force exerted to the cleaning liquid may be changed by changing the rotation speed of the cleaning jig 80 so that changing the flying trajectory of the cleaning liquid (scattering angle and flying distance) as depicted by arrows A, B, D. Thus, it is possible to change cleaned portions.

Moreover, although six through holes 89 are formed in the example illustrated in FIG. 10, the present disclosure is not limited thereto and a different number of through holes 89 may be formed. In addition, one through hole 89 may be formed at the central location of the top surface of the cleaning jig 80. In this case, the rotation cup 60 and the liquid collecting cup 62 may be mainly cleaned at one period of time and the substrate holding table 52 may be mainly cleaned at the other period of time by moving (e.g., reciprocating) the cleaning liquid supply location by the nozzle 55 between the central location of the top surface of the cleaning jig 80 and a location offset from the central location. Also, even when the through holes 89 are formed, the cleaning liquid may be supplied to the bottom surface of the cleaning jig 80 in the same aspect with the aspect illustrated in FIG. 7.

Further, in each of the above-described exemplary embodiments, the liquid processing apparatus is provided with a rotation cup 60 and a non-rotating liquid collecting cup 62 as a cup that receives the processing liquid scattered from a wafer. However, the present disclosure is not limited thereto and each of the cups may be configured only by a cup body. Also in this case, various sections of the cups and the members around the cups may be cleaned by using the above-described cleaning jig 80.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
a substrate holding unit configured to hold a substrate to be processed horizontally so that the substrate is processed with a processing liquid;
a substrate rotating mechanism configured to rotate the substrate holding unit; a cup configured to surround the substrate held by the substrate holding unit and receive the processing liquid after the processing liquid is supplied to the substrate;
a cleaning jig disposed on the substrate holding unit and configured to clean the cup, the cleaning jig being formed in a disc shape and provided with an inclined portion on a top surface thereof around an entire circumference in the vicinity of an outer circumferential edge of the cleaning jig, and the inclined portion of the cleaning jig being inclined upward toward an outside of the cleaning jig in a diameter direction;
a cleaning jig accommodating unit configured to accommodate the cleaning jig;
the substrate holding unit provided with a substrate holding body configured to hold the outer circumferential edge of the cleaning jig, wherein the outer circumferential edge of the cleaning jig has a shape which is held by the substrate holding body; and
a cleaning liquid supplying unit disposed at an upper side of the substrate holding unit and configured to supply a cleaning liquid,
wherein the inclined portion of the cleaning jig is angled such that a virtual line extended from an upper end of the inclined portion toward the outside of the cleaning jig is positioned above an upper portion of the cup, and the cleaning liquid supplied by the cleaning liquid supplying unit is supplied to a top surface of the cleaning jig.

2. The liquid processing apparatus of claim 1, wherein the cleaning jig is formed with a plurality of through holes at a central part of the top surface thereof, the through holes being configured to guide the cleaning liquid supplied to the top surface to the lower side of the cleaning jig through the cleaning jig.

3. The liquid processing apparatus of claim 1, wherein the cup includes a rotation cup attached to the substrate holding unit and a liquid collecting cup provided to surround the rotation cup, and the inclined portion is formed in an inclined shape such that the cleaning liquid is scattered toward a gap between the rotation cup and the liquid collecting cup.

4. The liquid processing apparatus of claim 1, wherein the cleaning jig includes a horizontal portion and the inclined portion, and a through hole is formed at a location where the horizontal portion and the inclined portion adjoin each other.

5. The liquid processing apparatus of claim 4, wherein the through hole is provided a plurality of times in the circumferential direction of the cleaning jig.

6. The liquid processing apparatus of claim 4, further comprising:
a guide part provided in the vicinity of the outer circumferential edge of the cleaning jig,
wherein the guide part is configured to guide the cleaning liquid discharged from the through hole of the inclined portion in a horizontal direction toward the outside in the diameter direction of the cleaning jig.

7. The liquid processing apparatus of claim 1, wherein the inclined portion is provided with inclined sections of at least two steps.

8. The liquid processing apparatus of claim 1, wherein the outer circumferential edge of the cleaning jig has a thickness equal to that of a circumferential edge of the substrate.

* * * * *